(12) United States Patent
Hirao et al.

(10) Patent No.: US 10,884,030 B2
(45) Date of Patent: Jan. 5, 2021

(54) CURRENT DETECTION DEVICE

(71) Applicant: Hitachi Automotive Systems, Ltd., Hitachinaka (JP)

(72) Inventors: Takashi Hirao, Tokyo (JP); Akihiro Namba, Tokyo (JP)

(73) Assignee: HITACHI AUTOMOTIVE SYSTEMS, LTD., Hitachinaka (JP)

(*) Notice: Subject to any disclaimer, the term of this patent is extended or adjusted under 35 U.S.C. 154(b) by 0 days.

(21) Appl. No.: 16/344,978

(22) PCT Filed: Dec. 4, 2017

(86) PCT No.: PCT/JP2017/043409
§ 371 (c)(1),
(2) Date: Apr. 25, 2019

(87) PCT Pub. No.: WO2018/131324
PCT Pub. Date: Jul. 19, 2018

(65) Prior Publication Data
US 2019/0271724 A1    Sep. 5, 2019

(30) Foreign Application Priority Data

Jan. 12, 2017  (JP) .................. 2017-003019

(51) Int. Cl.
*G01R 15/20* (2006.01)
*H02M 1/00* (2006.01)
(Continued)

(52) U.S. Cl.
CPC .............. *G01R 15/20* (2013.01); *H02M 1/00* (2013.01); *H02M 7/48* (2013.01);
(Continued)

(58) Field of Classification Search
CPC ......... G05B 1/00; G05B 2219/00; H02J 1/00; H01F 1/00
See application file for complete search history.

(56) References Cited

U.S. PATENT DOCUMENTS

2005/0161809 A1* 7/2005 Nakatsu ............. H02M 7/003
257/734
2006/0052957 A1* 3/2006 Hidehira ........... G01R 31/2806
702/58

(Continued)

FOREIGN PATENT DOCUMENTS

JP    2008-039734 A    2/2008
JP    2009-271044 A    11/2009

(Continued)

OTHER PUBLICATIONS

International Search Report with English translation and Written Opinion issued in corresponding application No. PCT/JP2017/043409 dated Mar. 6, 2018.

*Primary Examiner* — Jermele M Hollington
*Assistant Examiner* — Temilade S Rhodes-Vivour
(74) *Attorney, Agent, or Firm* — Foley & Lardner LLP

(57) ABSTRACT

In an object of the present invention, an object is to provide a technique for achieving higher accuracy in current detection of a radio frequency current, in a current detection device.

The current detection device of the present invention includes two or more conductors through which a current shunted from a same conductor flows; conductors through which the shunted current flows have portions opposed to each other; currents flow in opposite directions in opposing portions of the conductors; and a magnetic field detecting element is provided between the opposing portions of the conductors.

5 Claims, 12 Drawing Sheets

(51) Int. Cl.
*H02M 7/5387* (2007.01)
*H02M 7/48* (2007.01)
*H02P 27/06* (2006.01)

(52) U.S. Cl.
CPC .................. *H02M 7/53871* (2013.01); *H02M 2001/0009* (2013.01); *H02P 27/06* (2013.01)

(56) References Cited

U.S. PATENT DOCUMENTS

| | | |
|---|---|---|
| 2010/0045286 A1 | 2/2010 | Hotz |
| 2010/0194381 A1 | 8/2010 | Ito |
| 2011/0051371 A1* | 3/2011 | Azuma ................ H02M 7/003 361/699 |
| 2011/0310585 A1* | 12/2011 | Suwa .................. H05K 7/2089 361/820 |
| 2013/0279230 A1* | 10/2013 | Suwa ................ H05K 7/20927 363/141 |
| 2015/0214205 A1* | 7/2015 | Tokuyama .............. H01L 23/04 257/139 |
| 2015/0355241 A1 | 12/2015 | Kawanami |
| 2016/0033557 A1 | 2/2016 | Hwangbo |

FOREIGN PATENT DOCUMENTS

| | | |
|---|---|---|
| JP | 2010-048809 A | 3/2010 |
| JP | 2010-175474 A | 8/2010 |
| JP | 2015-132534 A | 7/2015 |
| WO | WO-2002/066997 A1 | 8/2002 |
| WO | WO-2014/132785 A1 | 9/2014 |
| WO | WO-2014/192625 A1 | 12/2014 |
| WO | WO-2015/075623 A1 | 5/2015 |

* cited by examiner

CURRENT DETECTION DEVICE

TECHNICAL FIELD

The present invention relates to a current detection device, and more particularly to a current detection device used in a power converter that supplies an AC current to a vehicle driving motor.

BACKGROUND ART

A current detection device for detecting a current flowing in a conductor of a power converter or the like is required to be downsized and to be improved with current detection accuracy.

PTL 1 discloses a technique that enables higher accuracy in current detection by setting extending directions of a plurality of flat-shaped conductors (bus bars) arranged in parallel.

CITATION LIST

Patent Literature

PTL 1: JP 2010-175474 A

SUMMARY OF INVENTION

Technical Problem

Regarding the current detection device as described above, the inventors of the present invention examined achievement of further higher accuracy in current detection, and as a result, the following problems have been found.

In PTL 1, when an AC current flows through a flat-shaped conductor such as a power converter, an increase of a frequency of the AC current reduces a current density at a center of the conductor, and increases a current density at an edge, due to a skin effect. As a result, when a current amount of the AC current is detected on the basis of a magnetic field generated by the flow of the AC current, the detection accuracy of the current amount may be deteriorated.

Therefore, an object is to provide a technique for achieving higher accuracy in current detection of a radio frequency current, in a current detection device.

Solution to Problem

In order to solve the above problem, a current detection device of the present invention includes two or more conductors through which a current shunted from a same conductor flows; conductors through which the shunted current flows have portions opposed to each other; currents flow in opposite directions in opposing portions of the conductors; and a magnetic field detecting element is provided between the opposing portions of the conductors.

Advantageous Effects of Invention

According to the present invention, it is possible to realize a current detection device in which current detection is highly accurate.

DESCRIPTION OF EMBODIMENTS

In a current detection device according to the present invention, there are provided two or more conductors through which a current shunted from a same conductor flows; conductors through which the shunted current flows have portions opposed to each other; currents flow in opposite directions in opposing portions of the conductors; and a magnetic field detecting element is provided between the opposing portions of the conductors.

Hereinafter, embodiments of the present invention will be described in detail with reference to the drawings.

The current detection device according to the present embodiment can be applied to detection of a current flowing through conductors of various power converters, but a case of being applied to a hybrid vehicle will be described as a representative example.

Figure 1:
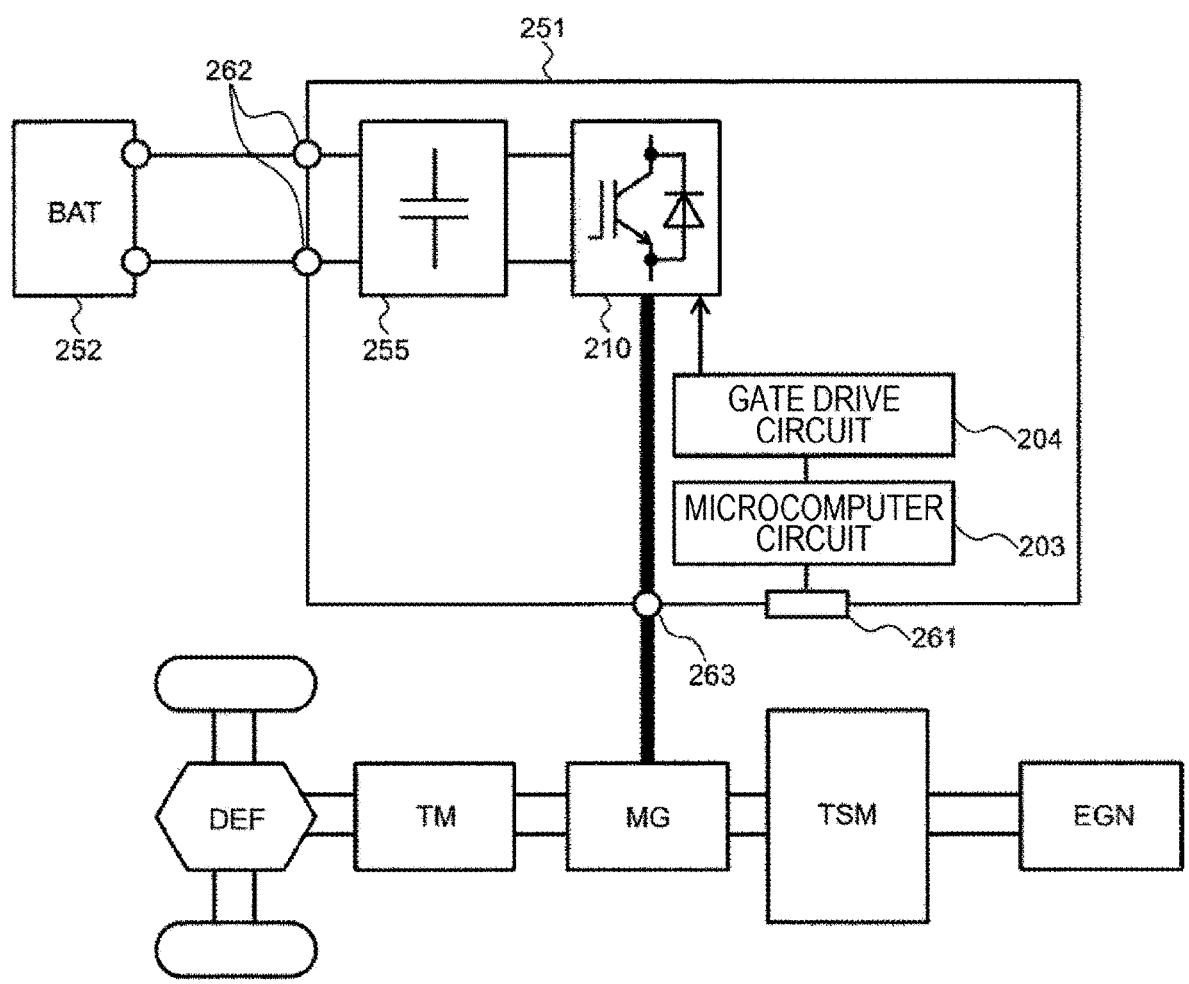
FIG. 1 shows a system configuration diagram of a vehicle of a hybrid system.

FIG. 1 shows a system configuration diagram of a vehicle of a hybrid system. An internal combustion engine EGN and a motor generator MG are power sources to generate a torque for traveling of the vehicle. In addition, the motor generator MG not only generates rotational torque, but also has a function of converting mechanical energy (rotational force) applied to the motor generator MG into electric power. The motor generator MG is, for example, a synchronous motor generator or an induction motor generator, and also operates as both an electric motor and a generator in accordance with a driving method of the vehicle.

An output side of the internal combustion engine EGN is transmitted to the motor generator MG via a power distribution mechanism TSM, and a rotational torque from the power distribution mechanism TSM or a rotational torque generated by the motor generator MG is transmitted to a wheel WH via a transmission TM and a differential gear DEF.

Whereas, during operation of regenerative braking, a rotational torque is transmitted from the wheel WH to the motor generator MG, and the motor generator MG generates AC power on the basis of the transmitted rotational torque. The generated AC power is converted into DC power by a power converter 251 and charges a high-voltage battery 252, and the charged electric power is used again as traveling energy.

The power converter 251 includes an inverter circuit 210 and a smoothing capacitor 255. The inverter circuit 210 is electrically connected to the battery 252 via the smoothing capacitor 255, and electric power is exchanged between the battery 252 and the inverter circuit 210. The smoothing capacitor 255 smoothes DC power supplied to the inverter circuit 210. A DC connector 262 is provided in the power converter 251, and electrically connects the battery 252 and the smoothing capacitor 255. An AC connector 263 is provided in the power converter 251, and electrically connects the inverter circuit 210 and the motor generator MG.

A microcomputer circuit 203 of the power converter 251 receives a command from a higher-level control device via a communication connector 261, and transmits data representing a state to a higher-level control device. The microcomputer circuit 203 calculates a control amount of the motor generator MG on the basis of the inputted command, generates a control signal on the basis of the calculation result, and supplies the control signal to a gate drive circuit 204. On the basis of this control signal, the gate drive circuit 204 generates a drive signal for controlling the inverter circuit 210.

In a case of operating the motor generator MG as an electric motor, the inverter circuit 210 generates AC power on the basis of DC power supplied from the battery 252, and supplies the AC power to the motor generator MG. A configuration consists of the motor generator MG and the inverter circuit 210 operates as a motor generator unit.

Figure 2:
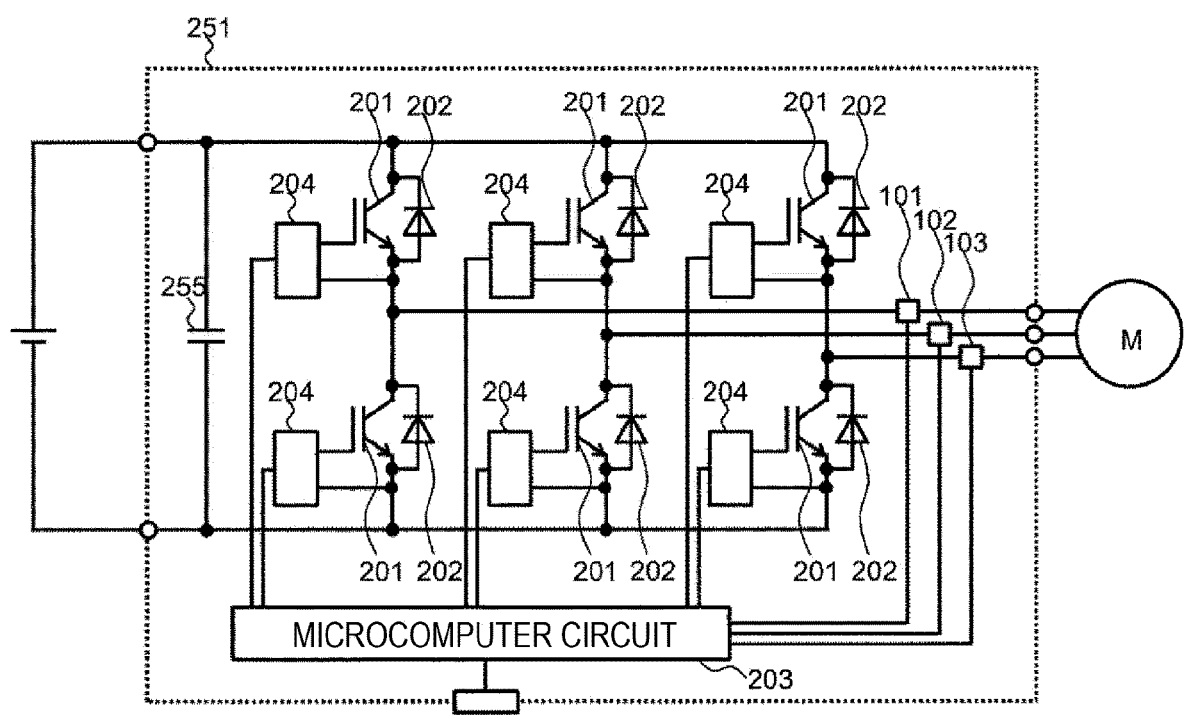
FIG. 2 is a circuit configuration diagram of a power converter 251.

FIG. 2 is a circuit configuration diagram of the power converter 251. In the following description, an example using an insulated gate bipolar transistor (IGBT) as a power semiconductor element will be described.

The power converter 251 includes an upper arm and a lower arm configured to include an IGBT 201 and a diode 202, in correspondence with three phases consisting of a U phase, a V phase, and a W phase of AC power. The upper and lower arms of these three phases form the inverter circuit 210.

A collector electrode of the IGBT 201 of the upper arm is electrically connected to a capacitor terminal on a positive electrode side of the smoothing capacitor 255, while an emitter electrode of the IGBT 101 of the lower arm is electrically connected to a capacitor terminal on a negative electrode side of the smoothing capacitor 255.

The IGBT 201 includes the collector electrode, the emitter electrode, and a gate electrode. Further, the diode 202 is electrically connected between the collector electrode and the emitter electrode. Meanwhile, a metal oxide semiconductor field effect transistor (MOSFET) may be used as a power semiconductor element, and in this case, the diode 202 is unnecessary. Silicon is widely used as a material to be a base material of the power semiconductor element, but SiC or GaN may be used.

The gate drive circuit 204 is provided between the emitter electrode and the gate electrode of the IGBT 201, and controls ON/OFF of the IGBT 201. The microcomputer circuit 203 supplies a control signal to the gate drive circuit 204.

Current detection devices 101 to 103 detect current amounts of the respective AC wirings of the U phase, the V phase, and the W phase, and feed back to the microcomputer circuit 203.

As described above, the microcomputer circuit 203 receives a feedback signal from the current detection devices 101, 102, and 103, generates a control signal for controlling the IGBT 201 constituting the upper arm or the lower arm of the inverter circuit 210, and supplies the control signal to the gate drive circuit 204.

The gate drive circuit 204 supplies a drive signal for driving the IGBT 201 constituting the upper arm or the lower arm of each phase, to the IGBT 201 of each phase on the basis of the control signal. The IGBT 201 performs an ON or OFF operation on the basis of the drive signal from the gate drive circuit 204 and converts DC power supplied from the battery 252 into three-phase AC power, and this converted power is supplied to the motor generator MG.

FIRST EMBODIMENT

Figure 3:
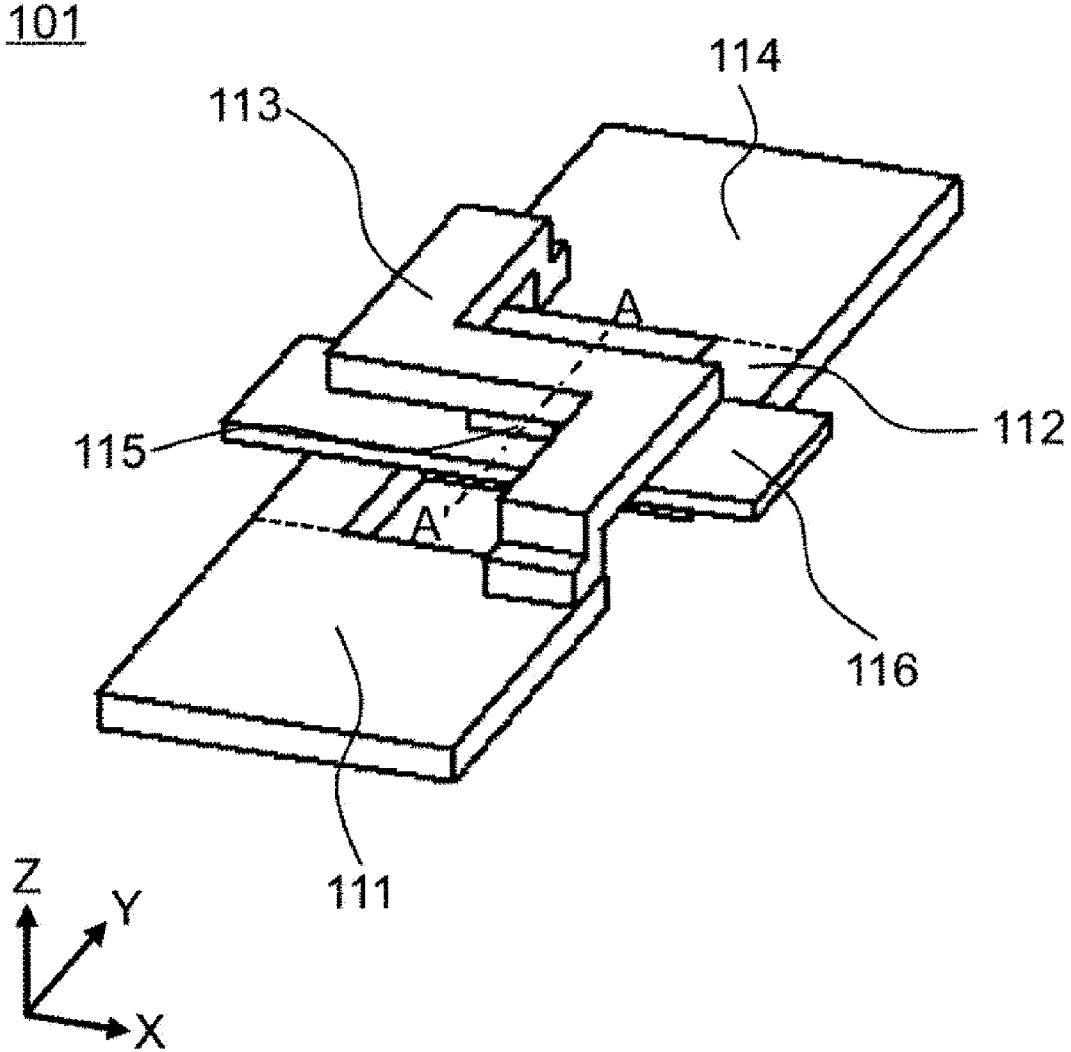
FIG. 3 is an external perspective view of current detection devices 101 to 103 according to a first embodiment.
Figure 4:
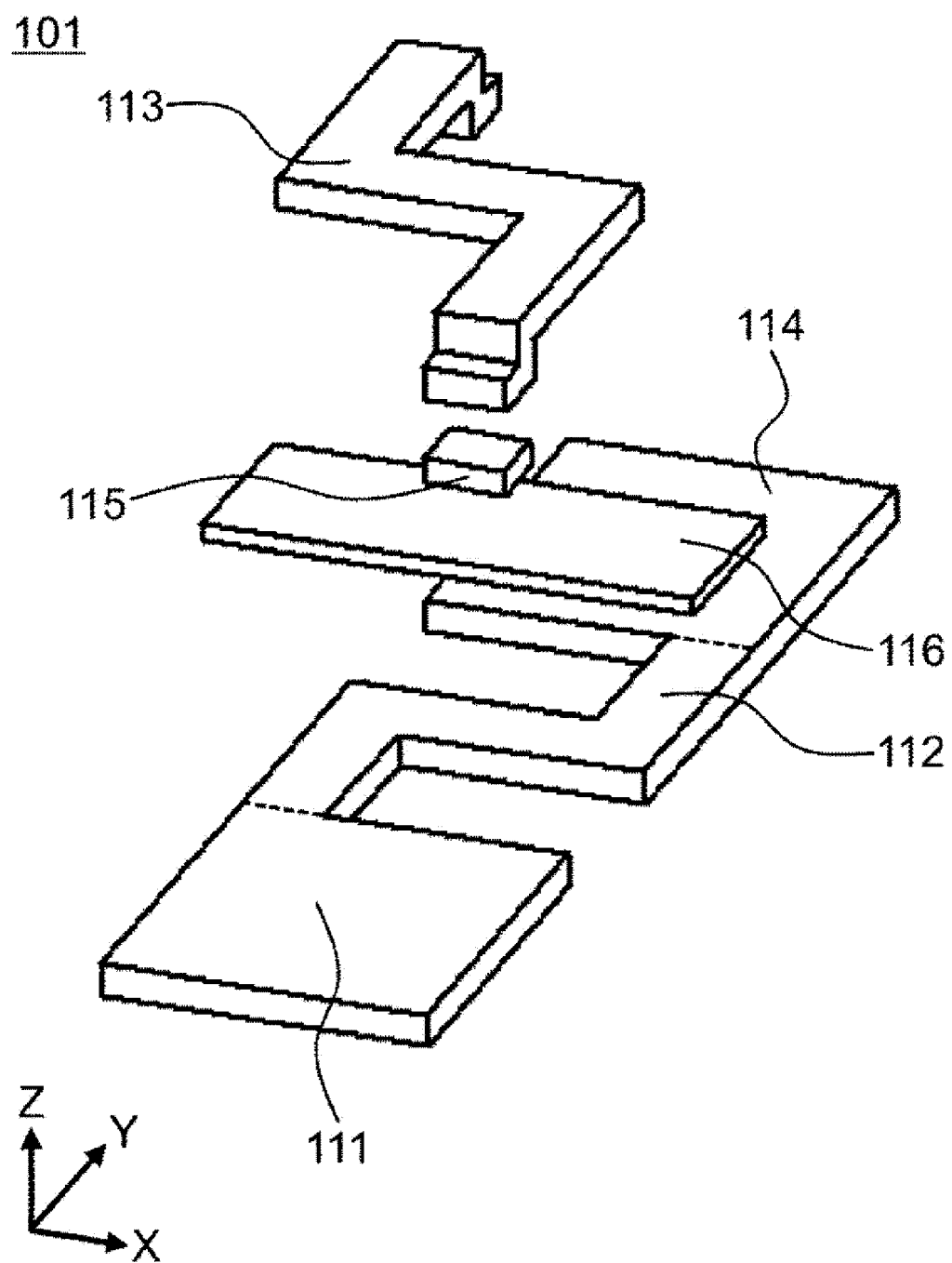
FIG. 4 is an exploded perspective view of the current detection device 101 according to the first embodiment.

FIG. 3 is an external perspective view of the current detection device 101 according to a first embodiment. FIG. 4 is an exploded perspective view of the current detection device 101 according to the first embodiment. The current detection devices 102 and 103 also have a configuration similar to the current detection device 101 shown in FIGS. 3 and 4.

A conductor 112 and a conductor 113 are connected to a conductor 111. Further, the conductor 112 and the conductor 113 are connected to a conductor 114. A power supply line and a signal line of a magnetic field detecting element 115 are wired in a wiring substrate 116.

The magnetic field detecting element 115 and the wiring substrate 116 are provided in a space between the conductor 112 and the conductor 113 that are arranged to be opposed to each other.

A current flowing through the conductor 111 is shunted into the conductor 112 and the conductor 113 and merged again at the conductor 114. Note that different numbers are given to the conductors 111 to 114 for convenience of explanation, but the conductor 111, the conductor 112, and the conductor 114 may be an integrated conductor, for example. For joining the conductors, solder joining, welding, and screwing can be used.

Further, in order to improve assembling property, the conductor 113, the magnetic field detecting element 115, and the wiring substrate 116 may be modularized. For example, a sealing material to seal the magnetic field detecting element 115 and the conductor 113 is provided, and a part of the conductor 113 protrudes from the sealing material and is connected to the conductor 111 at the protruding portion.

Figure 5:
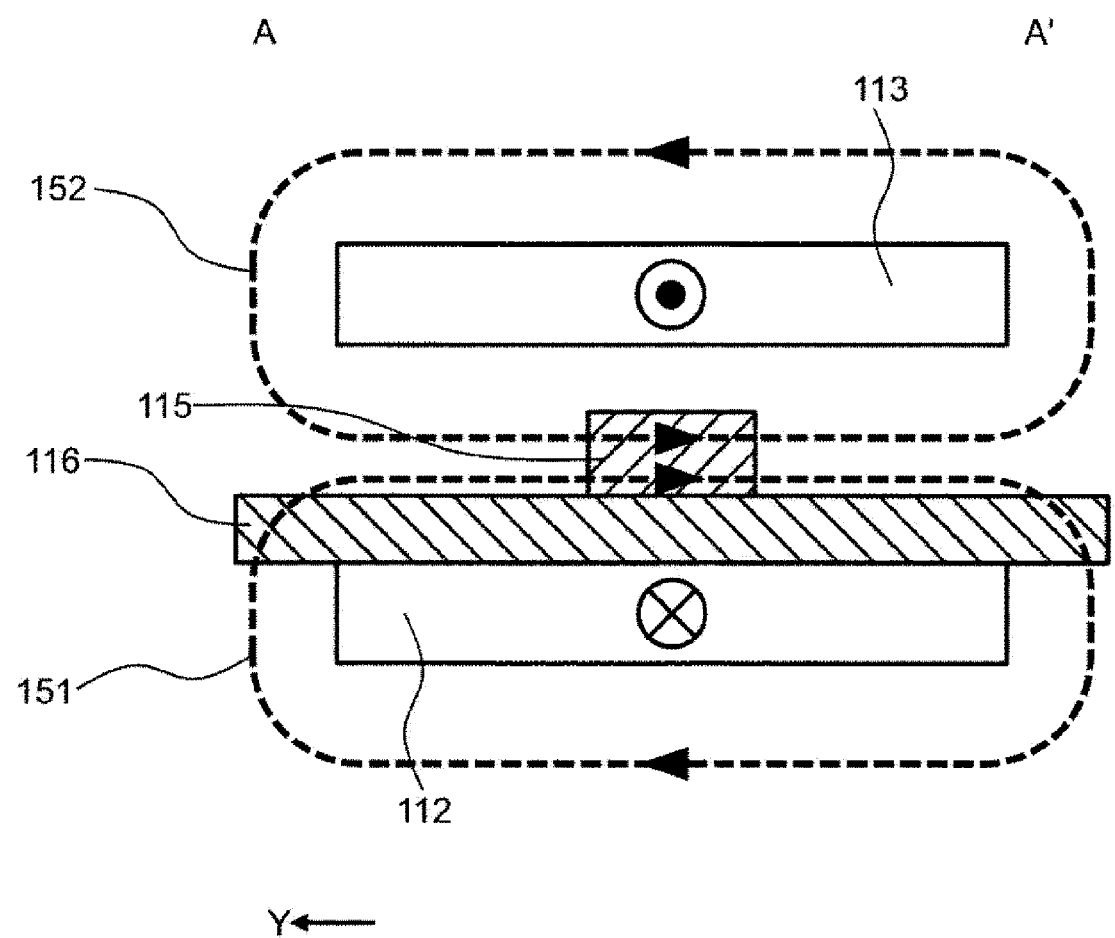
FIG. 5 is a cross-sectional view of a portion of A-A' in FIG. 3, for explaining a magnetic field detected by a magnetic field detecting element 115.

FIG. 5 is a cross-sectional view of a portion of A-A' in FIG. 3, for explaining a magnetic field detected by the magnetic field detecting element 115.

A current flows from front to back in the conductor 112, and a current flows from back to front in the conductor 113. The current flowing through the conductor 112 generates a magnetic field 151 in the clockwise direction. The current flowing through the conductor 113 generates a magnetic field 152 in the counterclockwise direction.

As a result, in the magnetic field detecting element 115, a total value of the magnetic field 151 and the magnetic field 152 is detected in the left to right direction (−Y direction). Since the current flowing through the conductor 112 and the conductor 113 is the current shunted from the conductor 111, the total value of the magnetic field 151 and the magnetic field 152 is in proportional to an amount of the current flowing through the conductor 111. Therefore, it is possible to detect the amount of the current flowing through the conductor 111 by the magnetic field detecting element 115.

Next, suppression of the skin effect of a radio frequency current flowing through a conductor will be described using a calculation result.

Figure 6:
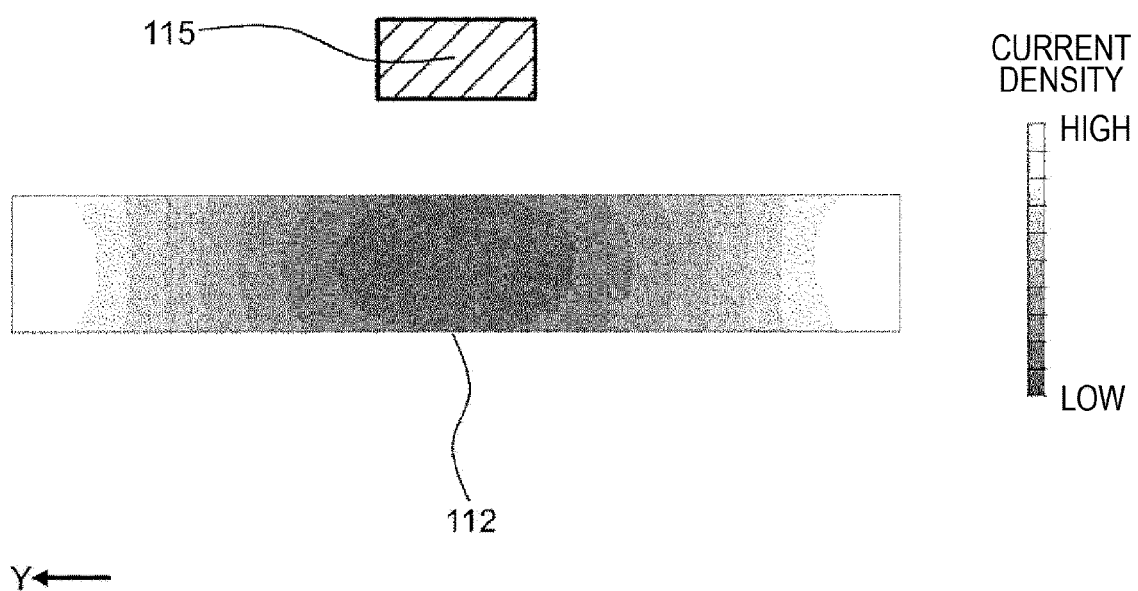
FIG. 6 is a view showing a calculation result of radio frequency current density distribution in a conductor when there is no opposing conductor.

FIG. 6 shows a calculation result of radio frequency current density distribution of the conductor 112 when there is no opposing conductor. In the density distribution of a current flowing through the conductor 112, a current density at a center decreases and a current density at an edge increases due to the skin effect. As a result, the magnetic field detected by the magnetic field detecting element 115 is reduced.

Figure 7:
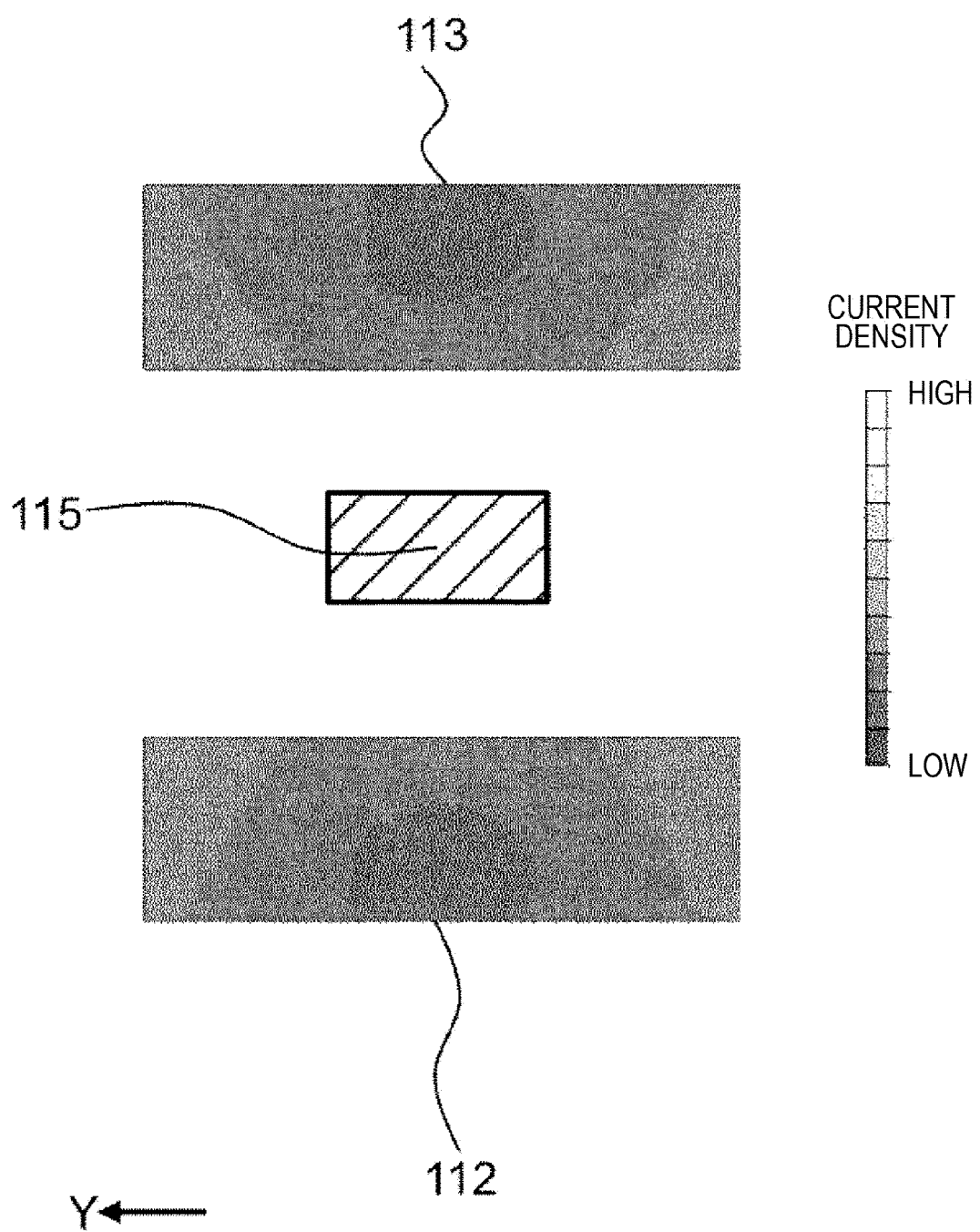
FIG. 7 shows a calculation result of radio frequency current density distribution of a conductor 112 and a conductor 113 when there is an opposing conductor.

FIG. 7 shows a calculation result of radio frequency current density distribution of the conductor 112 and the conductor 113 when there is an opposing conductor. Since currents of the conductor 112 and the conductor 113 flow individually in opposite directions, the influence of the skin effect is suppressed in the current density distribution of the conductor 112 and the conductor 113. As a result, reduction of the magnetic field detected by the magnetic field detecting element 115 can be suppressed, and higher accuracy in current detection can be achieved.

As described above, according to the present embodiment, it is possible to achieve higher accuracy in current detection of the radio frequency current.

SECOND EMBODIMENT

Figure 8:
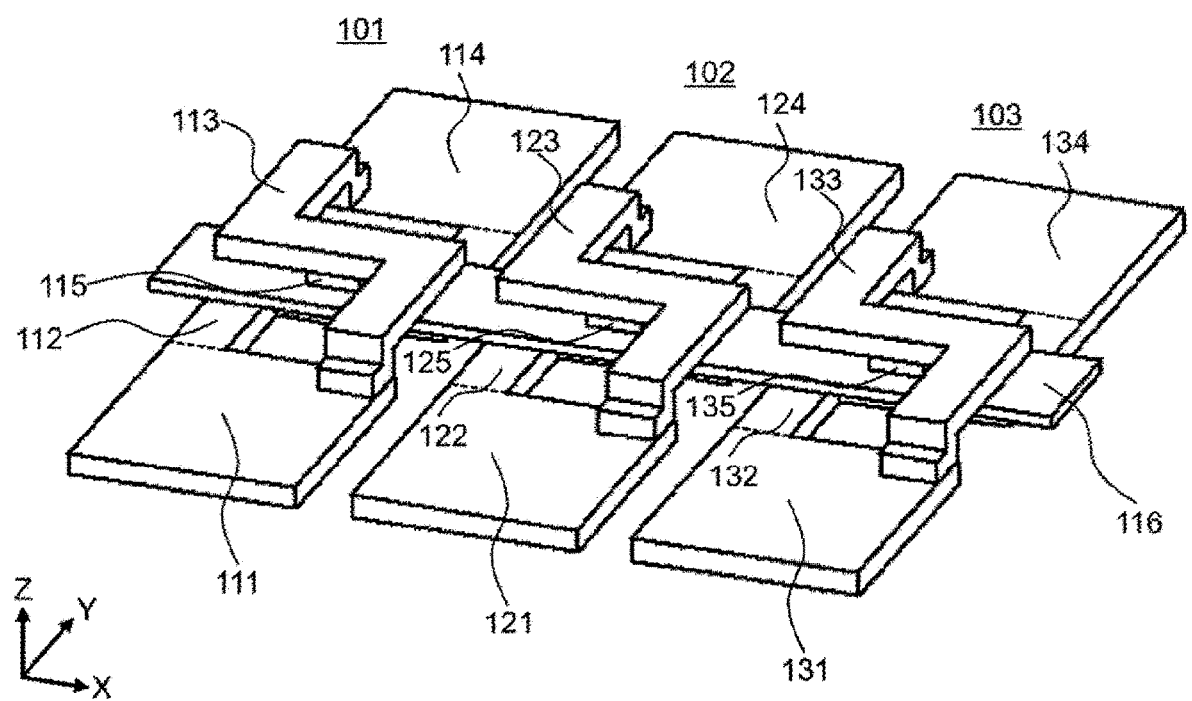
FIG. 8 is an external perspective view of current detection devices 101 to 103 according to a second embodiment.
Figure 9:
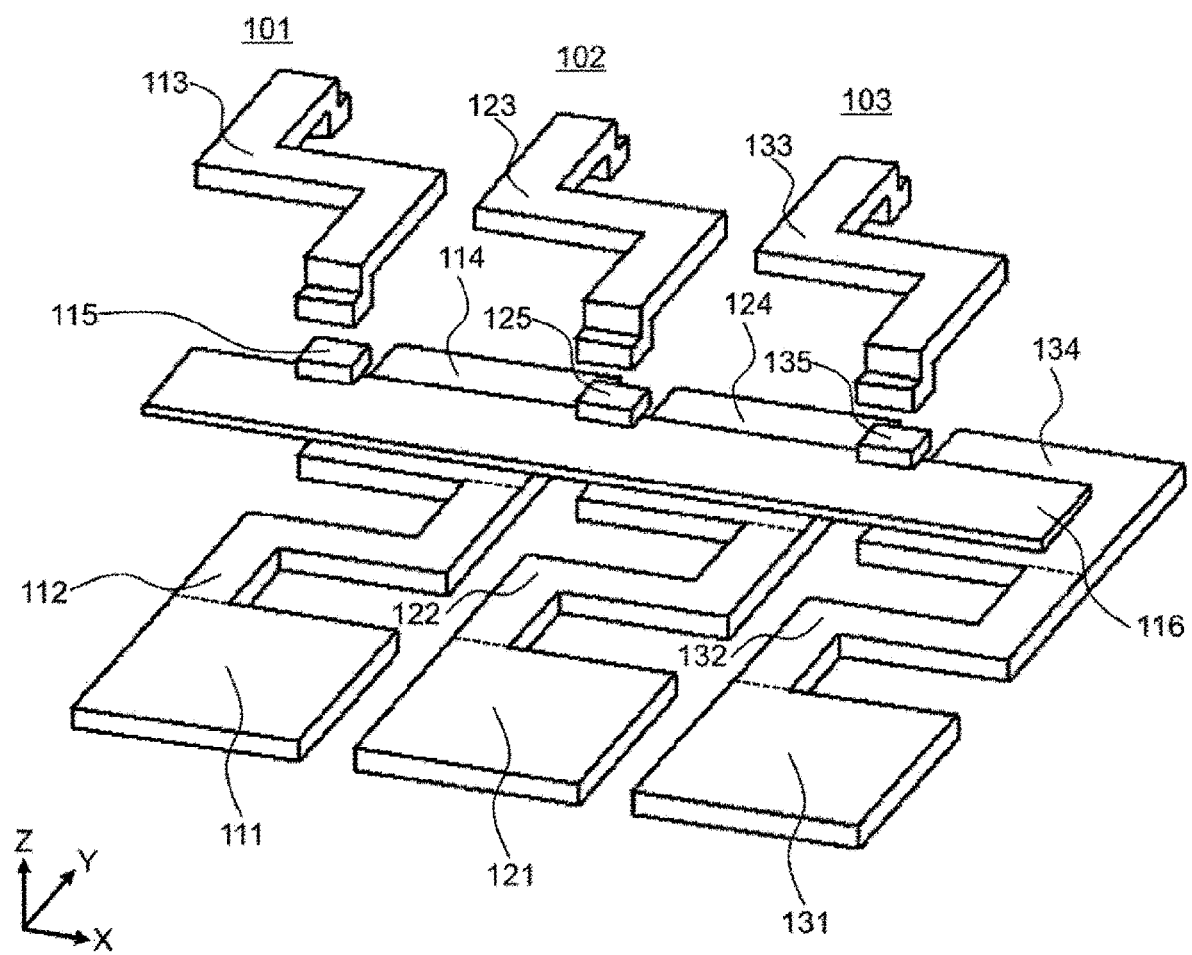
FIG. 9 individually shows an exploded perspective view of the current detection devices 101 to 103.

FIG. 8 is an external perspective view of current detection devices 101 to 103 according to a second embodiment. FIG. 9 individually shows an exploded perspective view of the current detection devices 101 to 103.

In the present embodiment, it is possible to detect currents in a plurality of wirings by arranging in parallel the current detection device 102 and the current detection device 103 similar to the current detection device 101 described in the first embodiment.

For example, in the power converter 251 shown in FIG. 2, a current of each AC wiring of the U-phase, the V-phase, and the W-phase can be detected. Further, since the magnetic field detected by a magnetic field detecting element 115, a magnetic field detecting element 125, and a magnetic field detecting element 135 is parallel to the magnetic field generated by other-phase currents, detection values of the magnetic field detecting element 115, the magnetic field detecting element 125, and the magnetic field detecting element 135 are unlikely to be affected by the other-phase currents.

According to the present embodiment, in addition to the effect similar to that in the first embodiment of the present invention, it is possible to achieve further higher accuracy in current detection by suppressing the influence of currents of other phases.

THIRD EMBODIMENT

Figure 10:
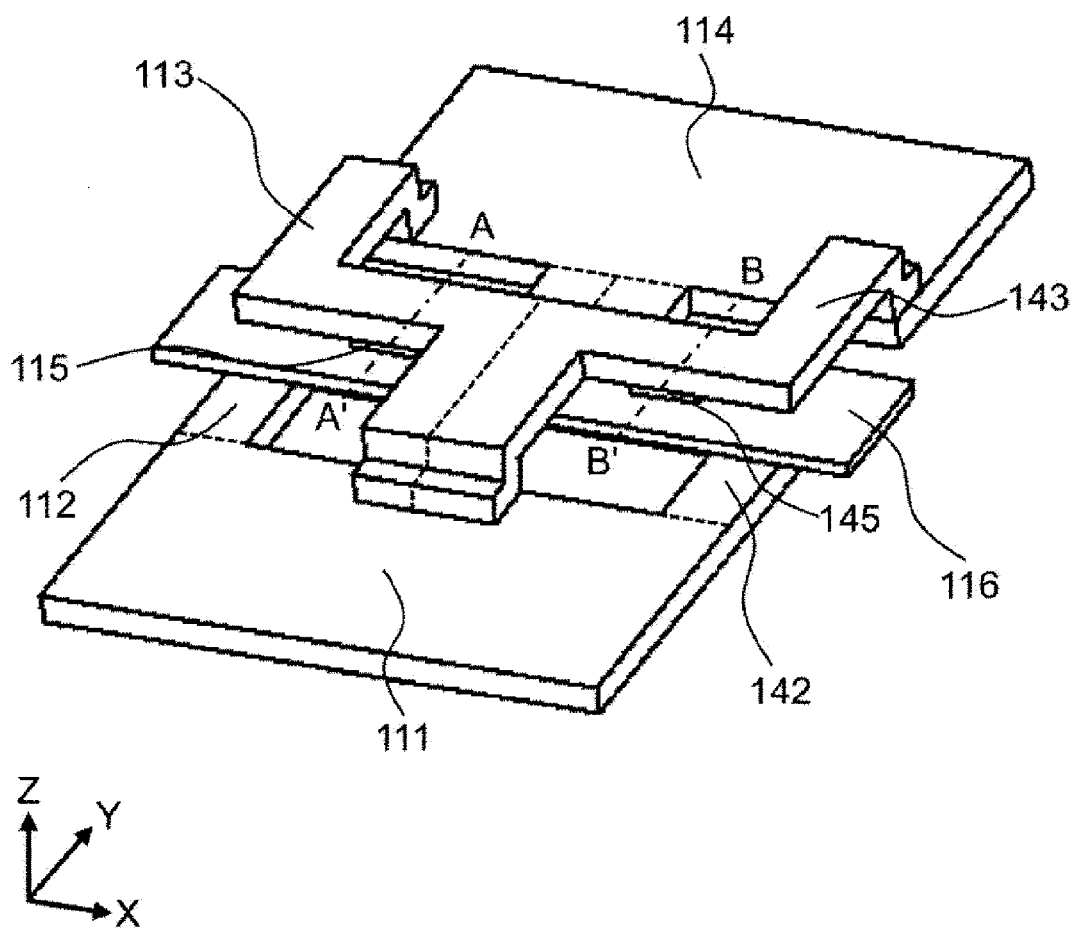
FIG. 10 is an external perspective view of a current detection device 401 according to a third embodiment.
Figure 11:
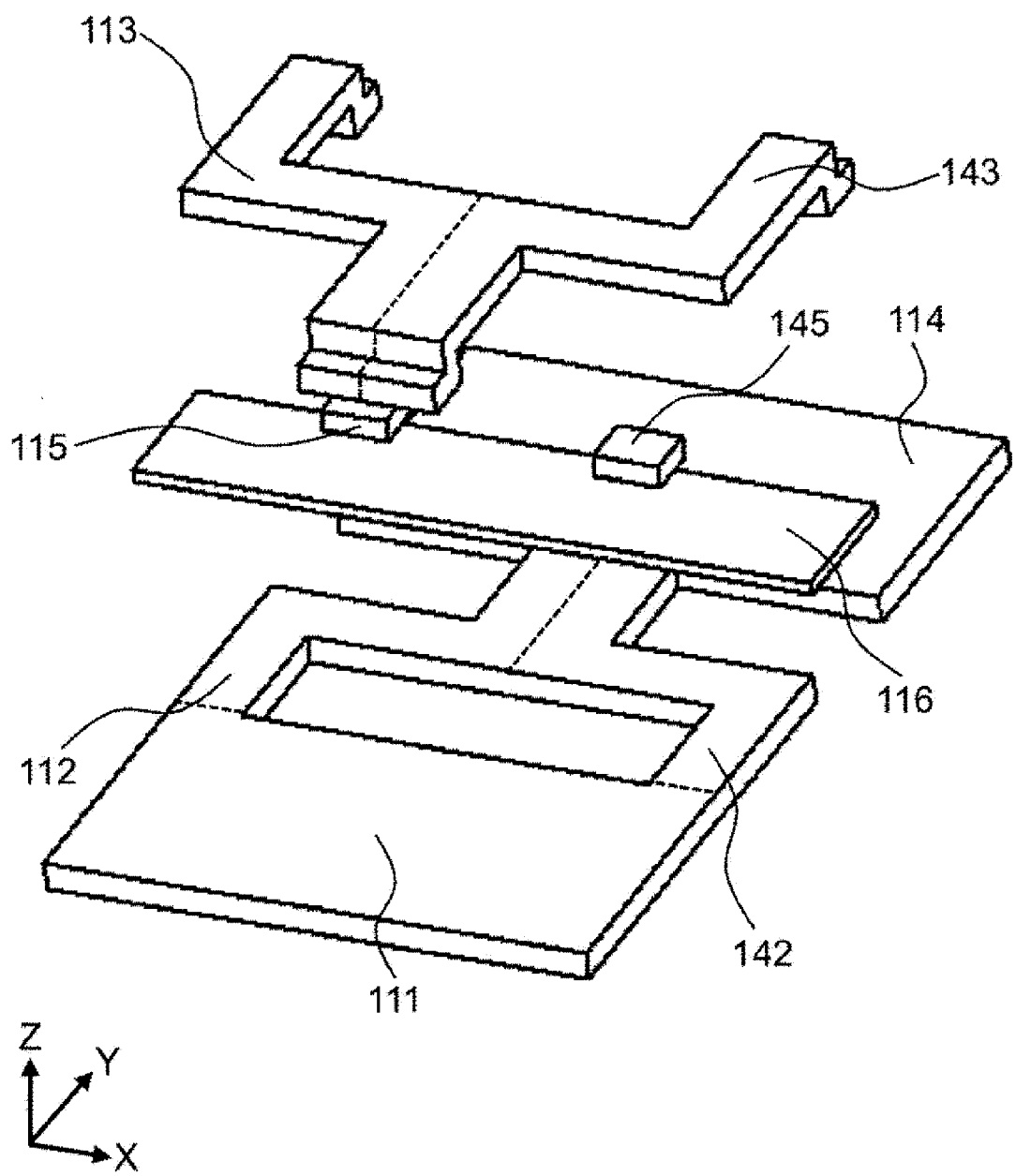
FIG. 11 is an exploded perspective view of the current detection device 401 according to the third embodiment.

FIG. 10 is an external perspective view of a current detection device 401 according to a third embodiment. FIG. 11 is an exploded perspective view of the current detection device 401 according to the third embodiment.

A conductor 112, a conductor 113, a conductor 142, and a conductor 143 are connected to a conductor 111. Further, the conductor 112, the conductor 113, the conductor 142, and the conductor 143 are connected to a conductor 114.

A magnetic field detecting element 115 is provided in a space between the conductor 112 and the conductor 113 that are arranged to be opposed to each other. Further, a magnetic field detecting element 145 is provided in a space between the conductor 142 and the conductor 143 that are arranged to be opposed to each other. Furthermore, a wiring substrate 116, on which a power supply line and a signal line of the magnetic field detecting element 115 and the magnetic field detecting element 145 are wired, is provided so as to penetrate between the conductor 112 and the conductor 113 that are arranged to be opposed to each other and between the conductor 142 and the conductor 143 that are arranged to be opposed to each other.

A current flowing through the conductor 111 is shunted into the conductor 112, the conductor 113, the conductor 142, and the conductor 143, and merged again at the conductor 114. The cross-sectional view of a portion of A-A' in FIG. 10 is similar to that in the FIG. 5.

Figure 12:
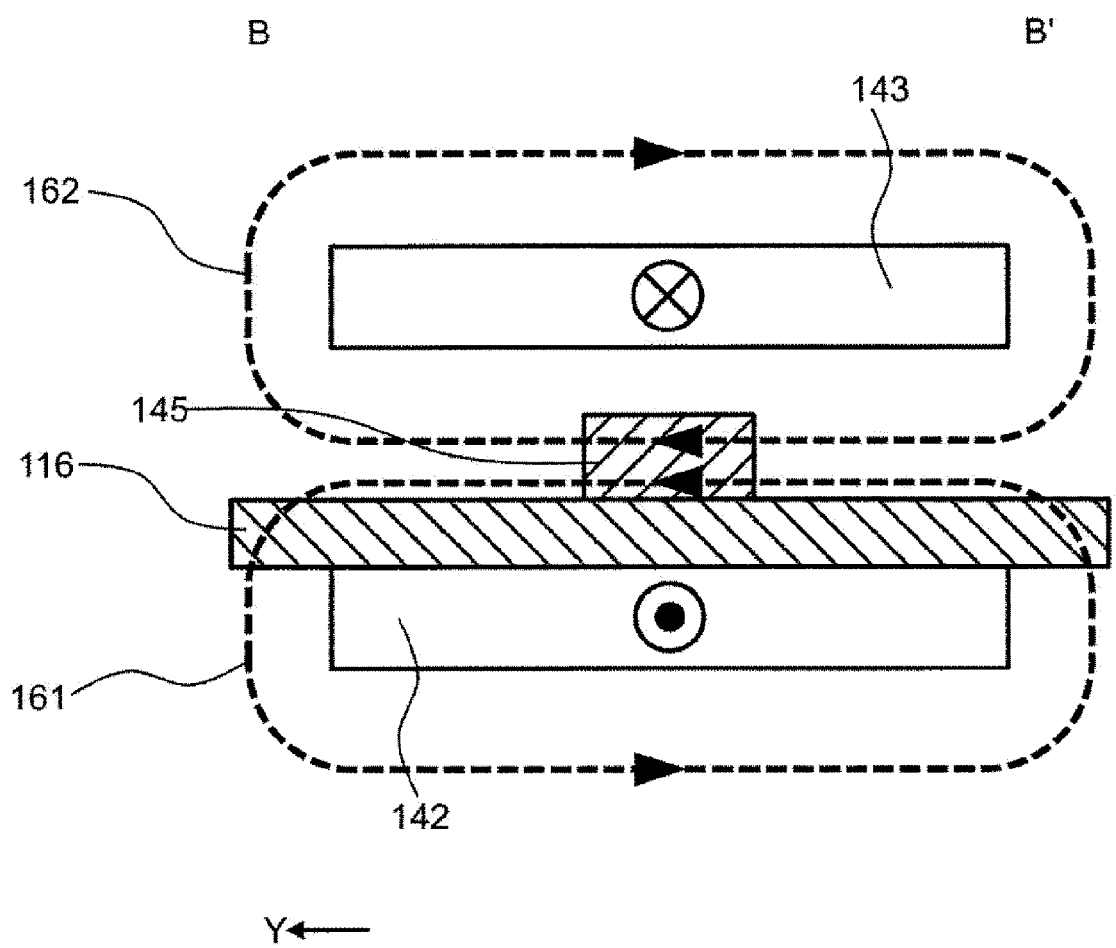
FIG. 12 is a view showing a cross-sectional structure of a portion of B-B' in FIG. 10.

FIG. 12 shows a cross-sectional view of a portion of B-B' in FIG. 3. In the magnetic field detecting element 145, a total value of a magnetic field 161 and a magnetic field 162 is detected in the right to left direction (+Y direction). Therefore, a total value of a magnetic field detection value in the −Y direction of the magnetic field detecting element 115 and a magnetic field detection value in the +Y direction of the magnetic field detecting element 145 is proportional to a value of the current flowing through the conductor 111. Therefore, it is possible to detect an amount of the current flowing through the conductor 111 by the magnetic field detecting elements 115 and 145. Further, since the magnetic field detecting elements 115 and 145 individually detect magnetic fields in opposite directions, a disturbance magnetic field in one direction (−Y direction or +Y direction) is canceled by summing magnetic field detection values of the magnetic field detecting elements 115 and 145. As a result, disturbance can be suppressed.

According to the present embodiment, in addition to the effect similar to that in the first embodiment of the present invention, it is possible to achieve further higher accuracy in current detection by suppressing disturbance of a magnetic field.

As described above, the present invention relates to a current detection device, and is particularly applicable to inverter systems used for hybrid vehicles or electric vehicles. Further, the present invention can also be used for driving systems of railway vehicles, and motor drives of general industries.

It should be noted that the technical scope of the present invention is not limited to each of the above-mentioned embodiments, and it is needless to say that various modifications are possible within the scope of the technical idea of the present invention.

REFERENCE SIGNS LIST 101 current detection device
102 current detection device
103 current detection device
111 conductor
112 conductor
113 conductor
114 conductor
115 magnetic field detecting element
116 wiring substrate
121 conductor
122 conductor
123 conductor
124 conductor
131 conductor
132 conductor
133 conductor 134 conductor
142 conductor
143 conductor
125 magnetic field detecting element
135 magnetic field detecting element
145 magnetic field detecting element
151 magnetic field
152 magnetic field
161 magnetic field
162 magnetic field
201 IGBT
202 diode
203 microcomputer circuit
204 gate drive circuit
210 inverter circuit
251 power converter
252 battery
255 smoothing capacitor
261 connector
262 DC connector
263 AC connector
DEF differential gear
EGN internal combustion engine
MG motor generator
TSM power distribution mechanism
WH wheel

The invention claimed is:

1. A current detection device comprising:
a first conductor;
a second conductor connected to the first conductor;
a third conductor connected to the first conductor; and
a first magnetic field detector,
wherein a current flowing through the first conductor is shunted into the second conductor and the third conductor,
the third conductor has an opposing portion that is opposed to the second conductor,
in the third conductor, the opposing portion is formed to cause a current flowing through the second conductor and a current flowing through the third conductor to be opposed to each other, and
the first magnetic field detector is disposed in a space between the opposing portion of the third conductor and the second conductor.

2. The current detection device according to claim 1, further comprising:
a sealing material that seals the first magnetic field detector and the third conductor,
wherein a part of the third conductor protrudes from the sealing material and is connected to the first conductor at the protruding portion.

3. A power converter for converting power by a power semiconductor element,
wherein the current detection device according to claim 1 is used for detecting a current amount.

4. The power converter according to claim 3,
wherein the current detection device is arranged to cause a current flowing through the first conductor to be substantially parallel to that of a current detection device of another phase.

5. A current detection device, comprising:
a first conductor;
a second conductor connected to the first conductor;
a third conductor connected to the first conductor; and
a first magnetic field detector, wherein a current flowing through the first conductor is shunted into the second conductor and the third conductor, the third conductor has an opposing portion that is opposed to the second conductor, in the third conductor, the opposing portion is formed to cause a current flowing through the second conductor and a current flowing through the third conductor to be opposed to each other, the first magnetic field detector is disposed in a space between the opposing portion of the third conductor and the second conductor, and
a fourth conductor connected to the first conductor; a fifth conductor connected to the first conductor; and a second magnetic field detector,
wherein a current flowing through the first conductor is shunted into the fourth conductor and the fifth conductor;
the fourth conductor has an opposing portion that is opposed to the fifth conductor,
in the fifth conductor, the opposing portion is formed to cause a current flowing through the fourth conductor and a current flowing through the fifth conductor to be opposed to each other,
the second magnetic field detector is disposed in a space between an opposing portion of the fifth conductor and the fourth conductor, and
the first magnetic field detector and a magnetic field detecting surface of the second magnetic field detector are opposed to each other.

* * * * *